United States Patent [19]
Nozaki et al.

[11] Patent Number: 5,824,452
[45] Date of Patent: Oct. 20, 1998

[54] RESIST COMPOSITIONS AND PROCESS FOR THE FORMATION OF RESIST PATTERNS

[75] Inventors: Koji Nozaki; Ei Yano; Keiji Watanabe; Takahisa Namiki; Miwa Igarashi; Yoko Kuramitsu, all of Kawasaki, Japan

[73] Assignee: Fujitsu Limited, Kawasaki, Japan

[21] Appl. No.: 610,345

[22] Filed: Mar. 4, 1996

[30] Foreign Application Priority Data

Mar. 27, 1995 [JP] Japan ................................. 7-068056

[51] Int. Cl.$^6$ ........................... G03C 5/00; G03C 1/725
[52] U.S. Cl. ................ 430/313; 430/283.1; 430/285.1; 430/287.1; 430/325; 430/330
[58] Field of Search ................................ 430/313, 325, 430/287.1, 330, 285.1, 283.1

[56] References Cited

U.S. PATENT DOCUMENTS

| | | | |
|---|---|---|---|
| 4,591,626 | 5/1986 | Kawai et al. | 526/282 |
| 5,169,740 | 12/1992 | Ushirogouchi et al. | 430/192 |
| 5,449,731 | 9/1995 | Suzuki et al. | 526/322 |

*Primary Examiner*—Janet C. Baxter
*Assistant Examiner*—Rosemary Ashton
*Attorney, Agent, or Firm*—Armstrong, Westerman, Hattori, McLeland & Naughton

[57] ABSTRACT

The negative-working resist composition which comprises a (meth)acrylate copolymer comprising (a) a vinyl monomer unit which contains in a side chain thereof at least one carbon—carbon double bond which does not concern itself with any polymerization reaction, but is able to be crosslinked with a crosslinking agent, (b) an acrylamide or methacrylamide monomer unit, (c) an acrylic acid or methacrylic acid monomer unit and (d) an acrylic acid or methacrylic acid adamantyl monomer unit as well as a crosslinking agent capable of being decomposed upon exposure to a patterning radiation and then causing crosslinking of said copolymer upon heating. The resist composition is particularly suitable for excimer laser lithography using an aqueous basic solution as a developer, and the formed resist patterns can exhibit a high sensitivity and excellent dry etch resistance without swelling.

7 Claims, 1 Drawing Sheet

RESIST COMPOSITIONS AND PROCESS FOR THE FORMATION OF RESIST PATTERNS

BACKGROUND OF THE INVENTION

1. Field of the invention

The present invention relates to a resist composition and a process for the formation of resist patterns using the same. More particularly, the present invention relates to a resist composition which can be exposed to any patterning radiation having a short wavelength such as excimer laser light and also can be subjected to development using an aqueous basic solution, after said resist composition is coated and exposed to a patterning radiation, and a process for the formation of negative-working resist patterns using such a resist composition. It should be noted that, as will be appreciated from the following detailed description of the present invention, the resist composition according to the present invention is distinguished from the conventional chemical amplification resists in view of the structure and functions of the polymeric material constituting the resist, and the composition can provide fine resist patterns having no swelled portion without suffering from any adverse influences due to varied environmental conditions in the resist process. Further, the thus produced resist patterns can provide a practically usable sensitivity and an excellent resistance to dry etching, because the structure of the acrylate or methacrylate (hereinafter referred to as "(meth)acrylate") copolymers constituting the resist has been modified for the purpose of obtaining such surprising effects. Accordingly, the present invention can be advantageously utilized in the production of semiconductor devices such as semiconductor integrated circuits, for example, LSIs, VLSIs, ULSIs and other devices, using a lithographic process.

2. Description of the Related Art

Recently, in the production of the semiconductor integrated circuits, the degree of integration thereof has been notably increased and accordingly LSIs and VLSIs have been produced on a commercial scale. The minimum line width of the circuit patterns in these devices approaches the sub-half micron or quarter micron order. In other words, in the production of these high performance devices, it is required to provide an established fine fabrication technology.

In the field of lithography, to satisfy the above requirements, an approach in which ultraviolet (UV) radiation as an exposure source is shifted to shorter wavelengths in the far or deep ultraviolet region has been suggested, along with research for providing new exposure devices provided with a light source capable of emitting such a short wavelength radiation in the deep ultraviolet region. In addition, there has been urged to find a novel resist material showing a less absorption to the above-mentioned shorter wavelength radiation, good sensitivity and high resistance to dry etching.

It should be noted that, recently, an exposure method using an argon fluoride (ArF) excimer laser having a wavelength of 193 nm as an exposure source has been developed to take an initiative in a next generation of the exposure technology in the production of semiconductor devices. Further, in view of such a tendency, it is an urgent necessity to find a resist material capable of providing, good sensitivity and resolution in such short wavelength regions. The resist material must satisfy the requirement concerning transparency at the wavelength of 193 nm, in addition to a good performance which is generally required in a conventional resist material. The conventional aromatic ring-containing photoresists, typical examples of which include a novolak resin and polyvinyl phenol resin, however, can not be used in the above-mentioned exposure method, because they are opaque at the wavelength of 193 nm due to their strong absorption at 193 nm. Alternatively, it is thought that introduction of a reaction mechanism of chemical amplification in the resist material would provide a highly increased sensitivity, however, the prior art chemical amplification-based resist materials are not considered to be satisfactory, because they still have the problem concerning their high susceptibility to the varied environmental conditions in the resist process. The problems of the prior art chemical amplification-based resist materials are as follows.

B. Reck et al., *Polym. Eng. Sci.*, 29, 960, (1989) teach a chemical amplification negative resist material in which the chemical amplification is based on an electrophilic aromatic ring-substitution reaction and which material contains a polyvinylphenol or novolak resin as a base resin. In this resist material, the substituted benzyl acetate as a latent electrophilic compound is used in combination with an onium salt as a photo acid generator (PAG). In this resist material, an acid is released from the PAG upon exposure of the material, and then the acid hydrolyzes the substituted benzyl acetate, thereby generating benzyl carbonium anions. Thereafter, the thus generated carbonium anions, upon post-exposure baking (PEB) of the exposed resist material, electrophilically attack an aromatic ring of the base resin, thus producing a crosslinked product thereof. In the exposed areas in which the crosslinked product was produced, an increase in the molecular weight is observed, i.e., notable differences in the solubility in an aqueous basic solution between the exposed areas and the nonexposed areas which are sufficient to obtain negative resist patterns are generated. The resist composition suggested by B. Reck et al. is satisfactory, if it is wished to obtain the resist patterns with a very high sensitivity, after exposure to krypton fluoride (KrF) excimer laser having a wavelength of 248 nm, slightly longer wavelength than ArF excimer laser, as an exposure source. However, when the ArF excimer laser is used in place of the KrF laser, it becomes impossible to obtain the resist patterns, because said resist composition has a transmittance of substantially zero at the wavelength of 193 nm. In addition, since the patterning process is based on a mechanism of chemical amplification, the resist material is liable to be adversely affected by the varied environmental conditions in the resist process. Accordingly, the resist material suffers from the unavoidable drawbacks such as variation in the size of the resulting resist patterns and pattern defects, for example, corrosive cutoff or curved edges, between the resist patterns and the underlying substrate. This means that the resist materials have to be used and fabricated with the greatest care.

On the other hand, C. J. Dubois et al., *8th Int. Conf. Elecron and Ion Beam Sci. Technol., Seattle*, 303 (1978) teach an acrylic crosslinkable chemical amplification negative resist material in which a copolymer of methylmethacrylate and 2,3-epithiopropylmethacrylate is used in combination with a diazonium salt. The resist material shows an excellent transparency to both the KrF and ArF excimer laser, however, its resistance to dry etching is poor. Therefore, generally, the resist material is not used alone or as a single resist layer, however, it is used in combination with another resist layer having a good resistance to dry etching.

As it can be seen from the above descriptions, the prior art chemical amplification resist materials cannot be utilized in the formation of the resist patterns in which the ArF excimer laser is used as an exposure source, and in addition to this drawback, they suffer from the problems that defective resist patterns are unavoidably formed due to variation of the environmental conditions in the resist process and that it is difficult to simultaneously attain both a good transparency and a good resistance to dry etching. Further, the conventional and well-known negative-working photoresists consisting of cyclic polyisoprene-bisazide, for example, "KTPR" commercially available from Eastman Kodak Company, "OMR" commercially available from Tokyo Oka Kogyo Co. and others, are insufficient to avoid swelling in the resulting resist patterns, because the resist patterns are formed upon development of the exposed resists with an organic solvent as a developer. The swelled resist patterns mean that the fine fabrication of the target substrate is limited to an insufficient level. Furthermore, another type of the conventional resist material, namely, X-ray resist consisting of the copolymer of allyl methacrylate and 2-hydroxyethyl, has no sensitivity in the ultraviolet region as will be appreciated from its reaction mechanism, and also its resistance to dry etching is poor. It is, therefore, desired to further improve this resist material.

The requirements in the prior art resist materials are various, and are contrary to each other. However, as is disclosed in Y. Kaimoto et al., *Advances in Resist Technology and Processing,* IX Proc. SPIE, 1672, 66–73 (1992), they found that all the requirements can be satisfied if the resist material is designed as a chemical amplification resist and it is constituted from a copolymer of adamantyl methacrylate and t-butyl methacrylate as a base resin and triphenylsulfonium hexafluoroantimonate as a photo acid generator. Surprisingly, since it uses adamantyl methacrylate as one monomeric component of the base copolymer, the resist material can exhibit a high transparency at both the wavelengths of 193 nm and 248 nm, and at the same time, a good resistance to dry etching. However, one drawback of this resist material is that the resist material is designed to form positive-working resist patterns and accordingly, using this resist material, negative resist patterns cannot be obtained.

SUMMARY OF THE INVENTION

One object of the present invention is to solve all the problems in the prior art resist materials, and to provide a novel resist composition which, when the shorter wavelength radiations such as KrF and ArF excimer laser light, especially ArF excimer laser light, are used as an exposure source, can form negative-working fine resist patterns having both a highly increased sensitivity and an excellent resistance to dry etching. Using the resist composition, the pattern formation process should avoid any adverse influences due to variation in the environmental conditions in the resist process, and should also be able to use an aqueous basic solution as a developer, thereby preventing swelling in the resulting resist patterns.

Another object of the present invention is to provide a novel process for forming resist patterns, especially negative resist patterns, using the resist composition of the present invention. The resist patterns obtained according to the present invention should not swell in the development process, in addition to exhibiting a high sensitivity and an excellent resistance to dry etching without suffering from any adverse influences due to the varied environmental conditions in the resist process.

The other objects of the present invention will be appreciated from the descriptions as set forth below with regard to the preferred embodiments thereof.

According to one aspect of the present invention, the above object can be attained by a resist composition for forming resist patterns which comprises:

A. a (meth)acrylate copolymer having a weight average molecular weight of 2,000 to 1,000,000, said copolymer comprising the following repeating units:
 (a) a vinyl monomer unit which contains in a side chain thereof at least one carbon—carbon double bond which does not concern itself with any polymerization reaction, but can be crosslinked with a crosslinking agent which is used in combination with said copolymer, said monomer unit being able to be copolymerized with an acrylic acid or methacrylic acid ester and being in an amount of more than 0 mole % and not more than 50 mole % based on said copolymer,
 (b) an acrylamide or methacrylamide monomer unit in an amount of more than 0 mole % and not more than 70 mole % based on said copolymer,
 (c) an acrylic acid or methacrylic acid monomer unit in an amount of more than 0 mole % and not more than 30 mole % based on said copolymer,
 (d) an acrylic acid or methacrylic acid adamantyl monomer unit in an amount of more than 0 mole % and not more than 70 mole % based on said copolymer, and B. a crosslinking agent capable of being decomposed upon exposure to a patterning radiation and then causing a crosslinking reaction of said copolymer upon the subsequent heating.

According to another aspect of the present invention, the above object can be attained by a process for the formation of resist patterns which comprises the steps of:

coating the above-mentioned resist composition of the present invention on a substrate to be fabricated, thereby forming a resist coating;

selectively exposing said resist coating to a patterning radiation capable of causing a decomposition of said crosslinking agent in said resist composition;

heating the exposed resist coating to a temperature at which a crosslinking reaction of said copolymer in said resist composition is induced; and developing the heated resist coating with an aqueous basic solution.

BRIEF DESCRIPTION OF THE DRAWINGS

The pattern formation process of the present invention will be more clearly understood from the description as set forth below with reference to FIG. 1A to FIG. 1D which illustrate, in sequence, a series of the steps for forming negative resist patterns according to the present invention.

DESCRIPTION OF THE PREFERRED EMBODIMENTS

Figure 1A:
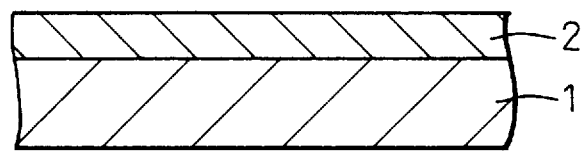

The inventors have found that the above-discussed problems of the prior art resist materials can be solved, if the reaction mechanism for forming resist patterns is modified so that the reaction does not rely upon an amplification function, i.e., a non-chemical amplification resist material is provided, and also the functions of the resist material are shared by four separate monomeric units constituting the copolymer as a base resin.

The present invention is directed to a resist material or resist composition which is suitable for forming negative resist patterns on a substrate to be fabricated, and for developing latent images in the exposed resist coating using an aqueous basic solution as a developer. The resist composition according to the present invention, as briefly mentioned in the above paragraph, comprises the (meth)acrylate copolymer as the base resin, and the copolymer comprises (a) a vinyl monomer unit, (b) an acrylamide or methacrylamide monomer unit, (c) an acrylic acid or methacrylic acid monomer unit, and (d) an acrylic acid or methacrylic acid adamantyl monomer unit in the described molar fractions.

The resist composition of the present invention comprises a mixture of the acrylate or methacrylate copolymer which contains a vinyl monomer unit which has a film-forming function and contains in a side chain thereof at least one carbon—carbon double bond capable of being crosslinked with a crosslinking agent as the first monomeric unit of the copolymer, as well as water-soluble monomer units as the second and third monomeric units and a monomer unit capable of ensuring a high dry etch resistance as the fourth monomeric unit, with a crosslinking agent capable of being decomposed upon exposure of the composition to the radiation suitable for causing crosslinking of the carbon—carbon double bond in said first monomeric unit.

The acrylate or methacrylate copolymer in the resist composition, when determined after the resist composition is coated at a layer thickness of 1 micron over a surface of quartz substrate, exhibits a moderate transparency, i.e., transmittance of at least 30% at the wavelength in the deep ultraviolet region of the exposure radiation.

The above requirement concerning the transmittance of at least 30% at the exposure wavelength is important in the resist design, i.e., the constitution of the resist composition of the present invention. Accordingly, in the resist composition of the present invention which is expected to be patternwise exposed to the radiation in the deep ultraviolet region, it becomes necessary to use as the first monomeric unit of the copolymer to be included in the resist composition a monomer unit which contains at least one carbon—carbon double bond which does not concern itself with any polymerization reaction, but is able to be crosslinked, exhibits a low absorption at the exposure wavelength, and is able to be copolymerized with an acrylic acid or methacrylic acid ester so that the transmittance of the copolymer at the exposure wavelength (the transmittance determined through a 1-μm-thick resist coating on a quartz substrate; the "transmittance" referred to hereinafter means a value determined under this condition) amounts to 30% or more. For example, it is contemplated to use monomers in which aromatic ring capable of highly absorbing deep ultraviolet radiation and/or a chromophore of higher molar absorptivity, such as conjugated double bond, is not contained. However, the above-mentioned specific structure will not be required in the monomeric unit of the copolymer, if a practically acceptable sensitivity can be obtained when the first crosslinkable monomeric unit is contained at a concentration of 1 mole % or less in the copolymer.

One example of the (meth)acrylate copolymer useful in the practice of the present invention in which deep UV radiation is used as a patterning or exposure radiation will be described hereinbelow with reference to use of vinyl methacrylate as the first monomeric unit thereof. In the following structural formula (I) of the copolymer, in order to distinguish them from each other, the four repeating units are referred to as, in the described order (from left to right), the first monomeric unit (a), the second monomer unit (b), the third monomer unit (c) and the fourth monomer unit (d).

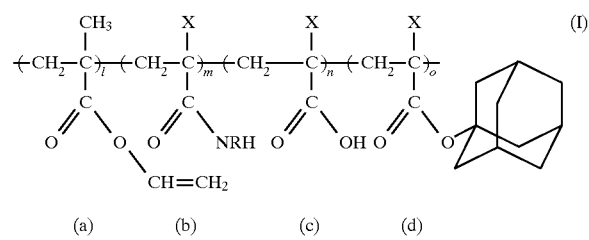

In the above formula,

X represents a hydrogen atom or a substituted or unsubstituted alkyl group of 1 to 3 carbon atoms such as methyl or ethyl, R represents a hydrogen atom or a substituted or unsubstituted, straight or branched chain alkyl group of 1 to 6 carbon atoms such as methyl, ethyl or t-butyl, and l, m, n and o each represents a molar fraction of the units (a), (b), (c) and (d). The alkyl group, as mentioned above, may be substituted with any substituent, and typical examples of suitable substituents include, for example, a lower alkyl group of 1 to 3 carbon atoms such as methyl and a halogen atom such as chlorine.

In the copolymers of the above formula (I) or other copolymers according to the present invention, the molar ratio, i.e., molar fraction, of the repeating units (a), (b), (c) and (d) is preferably $0<l \leq 50$, $0<m \leq 70$, $0<n \leq 30$, and $0<o \leq 70$, with the proviso that a sum of l, m, n and o is equal to or less than 100. More preferably, the molar fraction of the repeating units is $5 \leq l \leq 20$, $25 \leq m \leq 45$, $5 \leq n \leq 20$, and $40 \leq o \leq 60$, with the proviso that a sum of l, m, n and o is equal to or less than 100.

Further, it is preferred that the (meth)acrylate copolymer used in the present invention has a molecular weight, i.e., a weight average molecular weight, in the range of 2,000 to 1,000,000. More preferably, the molecular weight is in the range of 3,000 to 50,000, because such range of the molecular weight is effective in view of solubility of the unexposed resist composition in an aqueous basic solution.

In addition to the above requirements, it is preferred that the copolymer used in the present invention is transparent to the exposure radiation, and preferably it has a transmittance of 30% or more, more preferably, 60% or more, at the exposure wavelength, when deep UV radiation is used as the exposure source.

The first monomeric unit (a) in the above-mentioned (meth)acrylate copolymer of the formula (I) is vinyl monomers including vinyl methacrylate, for example. In the practice of the present invention, a wide variety of vinyl monomers, namely, monomers containing a crosslinkable double bond, may be used as the first monomeric unit (a), and typical examples thereof include, for example, acrylate, methacrylate, itaconate, vinyl acetate and derivatives thereof in which at least one double bond is included in an ester portion thereof, in addition to the vinyl methacrylate, although these monomers are not restrictive of the present invention. These ester groups may be a straight chain group or, if desired, they may be a cyclic group.

In other words, the first monomeric unit (a) may be any monomer and, accordingly, the ester structure thereof is not restricted, insofar as the monomers are crosslinkable with a crosslinking agent used with the monomers in the resist composition. For example, the ester groups suitable for deep UV exposure include cyclic or polycyclic alicyclic groups such as 2-cyclohexenyl, bicyclo [2. 2. 1]-5-heptene-2-methyl and the like, in addition to alkenyl groups such as vinyl, allyl and the like. The structures of these ester groups are shown as follows:

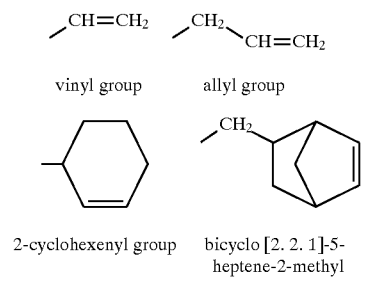

vinyl group    allyl group 2-cyclohexenyl group    bicyclo [2. 2. 1]-5-heptene-2-methyl For the first monomeric unit (a), in addition to the above-discussed ester structure, the monomers themselves may have any desired structure, insofar as they do not adversely affect the polymerization reaction and the transparency of the resulting copolymer to the exposure radiation. Alternatively, when the transparency of the copolymer does not cause any problem due to the certain exposure radiation, namely, when an electron beam or X-rays are used as an exposure source, any monomers containing, for example, an aromatic ring or a conjugated double bond may be used as the first monomeric unit, with the proviso that a practically usable sensitivity can be obtained with such monomers in the amount of 1 mole % or less.

The second monomeric unit (b) in the above-mentioned (meth)acrylate copolymer of the formula (I) is an acrylamide or methacrylamide monomer unit which is a water-soluble monomer. The nitrogen atom of the attached amide group in the monomeric unit may be substituted with any substituent, and preferably, the nitrogen atom may be monoalkylated with an alkyl group containing 6 or less carbon atoms. The alkyl group introduced as the substituent may be either a straight chain or a branched chain. However, if the below-mentioned reaction for forming imide in or between the molecules is considered, it is convenient to introduce a non-bulky alkyl substituent to the monomeric unit in order to avoid undesired reactions of the substituent due to their good reactivity. More preferably, the alkyl substituent used herein includes a saturated, straight chain alkyl group of 1 to 3 carbon atoms, typical examples of which include methyl and ethyl.

Further, the third monomeric unit (c) of the above-mentioned (meth)acrylate copolymer is an acrylic acid or methacrylic acid monomer unit which is also a water-soluble monomer as in the second monomeric unit. The monomeric unit may be substituted with any substituent, insofar as the substituent does not adversely affect on the resulting copolymer and, accordingly, the characteristics of the resist composition.

Furthermore, the fourth monomeric unit (d) of the above-mentioned (meth)acrylate copolymer is an acrylic acid or methacrylic acid adamantyl monomer unit. The adamantyl monomeric unit, as previously mentioned, is especially used herein for the purpose of obtaining an excellent dry etch resistance and, accordingly, in the practice of the present invention, if the comparable dry etch resistance can be obtained and also no adverse effect is applied to the resist characteristics, any other substituents may be used in place of the attached adamantyl group. Some examples of suitable substituents are as follows, however, one exception should be noted in that the benzyl substituent will not show a satisfactory result when an ArF laser is used as an exposure source:

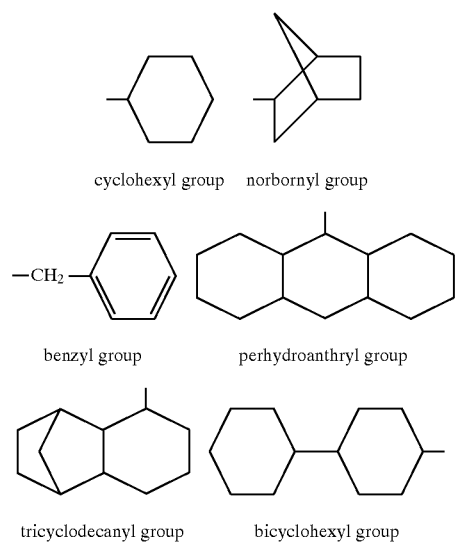

cyclohexyl group    norbornyl group benzyl group    perhydroanthryl group tricyclodecanyl group    bicyclohexyl group The (meth)acrylate copolymer used as the base resin in the resist composition of the present invention can be prepared in accordance with the conventional polymerization methods well-known in polymer chemistry. For example, the (meth)acrylate copolymer, as will be described in detail in the following examples, can be advantageously prepared by conducting a free-radical polymerization of the described monomers in the presence of 2,2'-azobisisobutylonitrile (AIBN) as a free-radical initiator.

In the resist composition according to the present invention, the composition contains as an essential component thereof a crosslinking agent capable of being decomposed upon exposure to a patterning radiation and then crosslinking the above-described (meth)acrylate copolymer upon the subsequent heating. The crosslinking agent used herein may be any crosslinking compound, insofar as it can provide the above crosslinking functions, and suitable crosslinking compounds include, for example, aromatic bisazide compounds and compounds conventionally used as a photopolymerization agent in the art. Using the aromatic bisazide compounds, the crosslinking reaction of the (meth) acrylate copolymer is initiated by nitrene released from the bisazide compound upon exposure of the resist coating containing these two components. The nitrene is then attached to a double bond of the first monomeric unit of the (meth)acrylate copolymer to form an aziridine ring, both ends of which can be crosslinked. Non-restrictive examples of the aromatic bisazide compounds useful as the crosslinking agent are as follows:

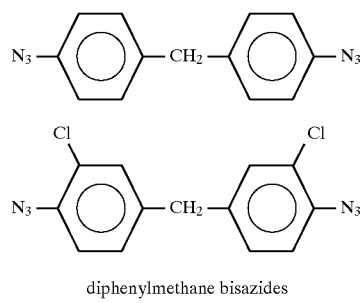

diphenylmethane bisazides

-continued

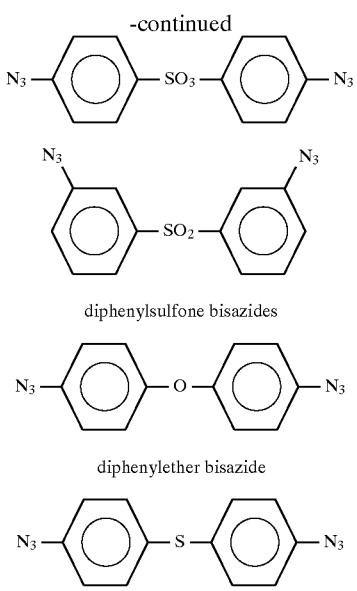

diphenylsulfone bisazides diphenylether bisazide

Non-restrictive examples of the photopolymerization initiator compounds useful as the crosslinking agent are as follows:

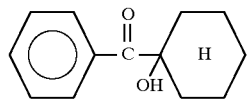

1-hydroxycyclohexylphenylketone

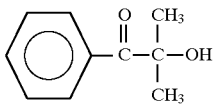

2-hydroxy-2-methyl-1-phenylpropane-1-one

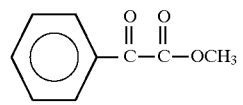

methyl phenylglyoxylate

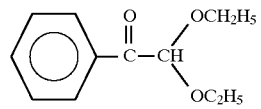

acetophenone diethylacetal

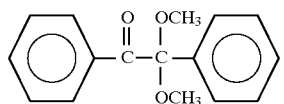

benzyldimethylketal

These crosslinking agents can be added to the resist composition in any desired amounts depending upon various factors such as the actual structure of the (meth)acrylate copolymer used as the base resin, the actual exposure radiation used and others. Generally, it is preferred that the crosslinking agent is added in the amount of about 0.1 to 50% by weight with regard to the base resin. Further, if an ArF excimer laser having a wavelength of 193 nm is used as an exposure source, it is preferred that the crosslinking agent is added in the amount of about 0.1 to 5% by weight with regard to the base resin. Furthermore, if desired, a suitable amount of conventional sensitizer may be added to the resist composition in order to increase the sensitivity of the same.

Generally, the resist composition according to the present invention can be advantageously used as a resist solution, after the above described (meth)acrylate copolymer and crosslinking agent were dissolved in a suitable organic solution. Typical examples of the organic solvent useful in the preparation of the resist solution, although they are not restricted to the below-mentioned, include ethyl lactate, methyl amyl ketone, methyl-3-methoxypropionate, ethyl-3-ethoxypropionate, propyleneglycol methyletheracetate and similar solvents. These organic solvents may be used alone or, if desired, may be used as a mixture of two or more solvents. The amount of the organic solvent used is not restricted, however, it is preferred that the solvent is used in an amount sufficient to provide a resist coating having a desired layer thickness and containing the (meth)acrylate copolymer in an amount of about 5 to 80% by weight.

In the preparation of the resist solution, if desired, an auxiliary solvent may be used in addition to the above-described organic solvent (hereinafter referred to as "main solvent"). The auxiliary solvent will assist in dissolving the resist components in the main solvent, and accordingly it can be advantageously used when the (meth)acrylate copolymer and/or crosslinking agent used have insufficient solubility in the main solvent. Useful auxiliary solvents, although they are not restricted to the below-mentioned, include butyl acetate, γ-butyrolactone, propyleneglycol methylether and similar solvents. Generally, these auxiliary solvents are preferably used in an amount of about 1 to 30% by weight, more preferably, about 5 to 20% by weight, with regard to the main solvent.

In addition, the present invention is directed to a novel process for forming negative resist patterns on a substrate. The pattern formation process according to the present invention can be carried out in the manner based on conventional lithographic processes, however, as previously mentioned, the present process must use the resist composition of the present invention in a series of described steps.

Generally, according to the present invention, negative resist patterns can be formed on a substrate in the manner illustrated in sequence in FIGS. 1A to 1D.

First, as is illustrated in FIG. 1A, the resist composition of the present invention is coated on a substrate 1 to be fabricated, to thereby form a resist layer or coating 2. The substrate used herein may be any conventional substrate used in the field of semiconductor devices and other devices, and typical examples of suitable substrates include a silicon substrate, a glass substrate, a SOS substrate, a non-magnetic substrate and the like. If desired, the substrate may additionally contain one or more overlaying layers such as a silicon oxide layer, metallic wiring layer, insulating interlayer, magnetic layer and the like. Further, the substrate and/or the overlaying layer(s) may contain any elements such as wirings or circuits fabricated therein. Furthermore, in order to increase an adhesion strength of the resist layer to the substrate, a surface of the substrate may be subjected to a conventional hydrophobic treatment. Typical examples of the chemicals advantageously used in this treatment is 1,1,1,3,3,3-hexamethyldisilazane (HMDS) and the like.

Coating of the resist composition can be made from a resist solution containing the same composition as set forth in the above paragraphs. The resist solution can be preferably coated over the substrate surface by spin-coating, although any other conventional coating methods such as roller coating and dip coating may be used, if desired. The layer thickness of the resist coating is preferably in the range of about 0.1 to 200 μm, and it is preferably in the range of about 0.1 to 1 μm for the ArF lithography. Note, however, that the layer thickness of the resist coating may be varied depending upon different factors such as the intended use of the resulting resist patterns.

The resist coating 2 formed on the substrate 1 is generally, and preferably, prebaked at a temperature of about 60° to 160° C. for about 60 to 120 seconds, before selective exposure of the coating 2 to patterning radiation. Prebaking may be carried out by using any heating means conventionally used in the resist process. Suitable heating means include, for example, a hot plate, infrared (IR) heating oven, microwave heating oven and the like.

Figure 1B:
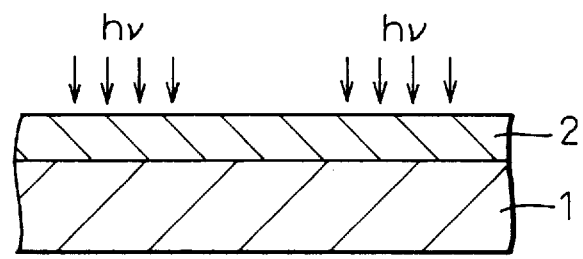

Next, as is shown in FIG. 1B, the prebaked resist coating 2 is selectively exposed to a patterning radiation (see, arrows) in conventional exposure devices or aligners. Suitable exposure devices include commercially available devices such as ultraviolet (far UV or deep UV) exposure devices, X-ray exposure devices, electron beam exposure systems and excimer steppers, for example. The conditions of exposure can be varied to select the optimum condition in each process, taking various factors into consideration. Particularly, in the practice of the present invention, as can be appreciated from the above descriptions, the patterning exposure can be advantageously made by using an excimer laser such as a KrF laser (wavelength of 248 nm) and an ArF laser (wavelength of 193 nm) as the exposure source. Note, in this connection, that the term "radiation" used herein is intended to mean any radiation from various available light sources such as UV radiation, far UV radiation, deep UV radiation, electron beam (EB), laser light and the like. As a result of the selective exposure, the crosslinking agent in the exposed areas of the resist coating 2 is decomposed, and thus the exposed resist coating 2 is now on the ready for the crosslinking reaction which is expected to be caused in the subsequent step.

Alternatively, in place of using the excimer light, a deep UV radiation may be used as the exposure radiation, and in such a case, the resist composition used should be modified so that a transmittance of the copolymer as the base resin is 30% or more at the wavelength of the deep UV radiation. According to the present invention, such a modification of the resist composition can be attained by introducing, as the first monomeric unit of the copolymer, a vinyl monomer which does not contain an aromatic ring capable of strongly absorbing radiations in the deep UV region or a chromophore having higher molar absorptivity such as conjugated double bonds but does contain, in a side chain thereof, at least one carbon—carbon double bond capable of being crosslinked with a crosslinking agent and of being copolymerized with an acrylate or methacrylate.

Figure 1C:
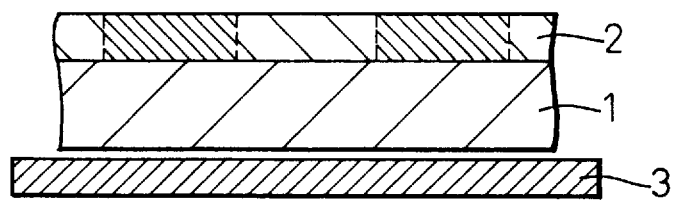

After completion of the selective exposure, as is shown in FIG. 1C, the exposed resist coating 2 is heated on a hot plate 3. As mentioned above, the heating is called Post-Exposure Baking (PEB), and PEB is preferably carried out at a temperature sufficient to cause crosslinking of the copolymer in the resist coating and is, generally, a temperature of about 80° to 160° C. for about 30 to 240 seconds. As a result of heating, the (meth)acrylate copolymer in the exposure regions of the resist coating 2 is crosslinked to form a crosslinked copolymer which is insoluble in an aqueous basic solution used as a developer in the next development step.

Figure 1D:
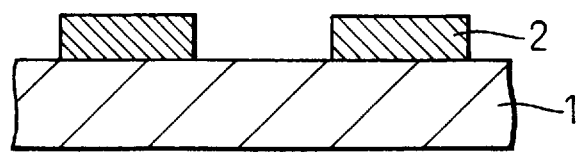

As a final step of the present process, the heated resist coating is developed with the aqueous basic solution in accordance with any conventional method. Suitable apparatuses for use in this development step include the well-known developers such as a spin developer, dip developer and spray developer. Further, typical examples of the aqueous basic solution suitable as the developer include an aqueous solution of hydroxide of metals belonging to the groups I and II of the periodic table such as potassium hydroxide or an aqueous solution of organic bases free from metal ions such as tetraalkylammonium hydroxide, for example, tetramethylammonium hydroxide (TMAH), tetraethylammonium hydroxide (TEAH) and tetrabuthylammonium hydroxide (TBAH). More preferably, tetramethylammonium hydroxide (TMAH) can be used as the developer. Furthermore, if desired, the aqueous basic solution used as the developer may additionally contain any additives such as a surface active agent in order to improve the resulting development effect. As a result of developing, as is illustrated in FIG. 1D, the unexposed areas of the resist coating 2 are dissolved and removed from a surface of the substrate 1, thereby forming the desired resist patterns corresponding to the exposed areas of the resist coating.

For the purpose of assisting in easy understanding of the present invention, the formation of the resist patterns according to the present invention will be further described with reference to the reaction mechanisms included therein.

The present invention is directed to the formation of negative patterns by using, as a resist composition having a practically usable sensitivity and being not based on a chemical amplification reaction, a resist material capable of being dissolved in an aqueous basic solution and containing a mixture of the (meth)acrylate copolymer which comprises a monomer unit which has a film-forming property and contains, in a side chain thereof, at least one carbon—carbon double bond capable of being crosslinked with a crosslinking agent as the first component (a), two water-soluble monomers as the second and third components (b and c), and a monomer ensuring an excellent dry etch resistance as the fourth component (d), with a crosslinking agent capable of being decomposed upon exposure to a patterning radiation and then causing a crosslinking reaction of said copolymer upon the subsequent heating.

In the formation of negative patterns, the resist composition used may be the material based on the copolymer in which the first component (a) is a vinyl monomer, and the monomer does neither contain an aromatic ring capable of strongly absorbing radiation in the deep UV regions of the spectrum nor a chromophore having a higher molar absorptivity such as a conjugated double bond, however, the vinyl monomer contains in a side chain thereof at least one carbon—carbon double bond capable of being crosslinked with a crosslinking agent, and also is copolymerizable with an acrylate or methacrylate, said copolymer thus having a transmittance of 30% or more at the exposure wavelength in the deep UV regions of the spectrum. Note, it will be appreciated that in this process deep UV radiation should be used as the exposure source.

When an aromatic bisazide compound is used as the crosslinking agent in the resist composition, nitrene and nitrogen will be generated, in the following reaction scheme, during exposure of the resist coating to the patterning radiation:

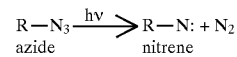

in which R represents an aromatic group.

Then, the generated nitrene will cause the following different reactions:

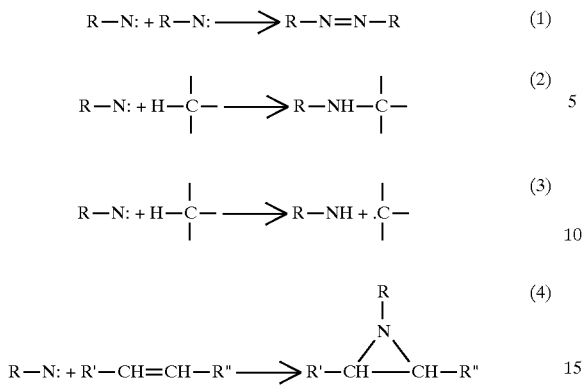

Among these reactions, if actual reactions such as reactions (2) and (3) occur on both the azide portion of the (meth)acrylate copolymer and the azide portion of the crosslinking agent, a molecular weight in the exposed areas of the resist coating will be increased as a function of the crosslinking reaction in said portions. Further, any radicals generated during an actual reaction such as reaction (3) will cause a hydrogen-replacement reaction with the amide moiety in the copolymer, followed by combining with a carboxyl group in a neighborhood of said reaction site to form an imide in or between molecule, or any radicals generated upon the reaction (3) will withdraw hydrogen from said carboxyl group, followed by the reaction of the generated carbonyl radical with an amide moiety in a neighborhood of said reaction site to form an imide in or between molecules. In any case, the acidity of the resist material or resin is lowered. Since the above-mentioned reactions are simultaneously caused in combination, a dissolution velocity in the areas of the resist coating exposed to an aqueous basic solution is lowered, thereby generating a difference in the dissolution velocity between the exposed and unexposed areas of the resist coating. Thus, the intended negative patterns are produced.

The above-discussed reactions do not involve any amplification function which can be found in the conventional chemical amplification resists. In other words, the resist composition of the present invention is classified under the category of the non-chemical amplification resist, and in designing the structure of the (meth)acrylate copolymer in the resist composition, it is not required to consider a problem of the prior art chemical amplification resists, i.e., instability of the resists to environmental conditions applied in the resist process. Further, since an aqueous basic solution can be used as a developer of the exposed resist coating, it becomes possible to form resist patterns without swelling thereof. Furthermore, since a crosslinking agent to be incorporated in the resist composition of the present invention can be suitably selected depending upon the wavelength of the patterning radiation used, it also becomes possible to use ultraviolet radiations, which are being principally used in current lithography, such as g-line and i-line radiation. In addition, the resist composition of the present invention can be advantageously used in an electron beam (EB) and X-ray lithography using high energy radiations as a patterning radiation, since the resist composition can exhibit a high sensitivity to such high energy radiations. However, it will be appreciated from the above detailed descriptions that the most preferable exposure radiation in the practice of the present invention is deep UV radiations such as KrF and ArF excimer laser light, because the (meth)acrylate copolymer in the resist composition is highly transparent to such exposure radiation, and the expected formation of an imide in or between the molecules can be easily accelerated at a relatively low level of exposure dose.

EXAMPLES

The present invention will be further described with reference to the appended working examples. Note, however, that the examples are appended herein for only explanation purpose and they are not restrictive of the present invention.

Example 1

Preparation of Poly(vinylmethacrylate-co-N-methylmethacrylamide-co-methacrylic Acid-co-adamantylmethacrylate)

To a 1 l-volume eggplant-shaped flask, was added 2.80 g (25 mmol) of vinyl methacrylate, 7.93 g (80 mmol) of N-methylmethacrylamide, 23.74 g (150 mmol) of trimethylsilyl methacrylate, 67.70 g (325 mmol) of adamantylmethacrylate, a Teflon™-coated stir bar, 190 mL of dioxane and 13.79 g (84 mmol) of 2,2'-azobisisobutylonitrile (AIBN), and the content in the flask was stirred at 80° C. for 7 hours in a nitrogen atmosphere. To the reaction solution, 100 mL of a water-methanol (1:1) solution containing 10 g of the dissolved citric acid was added, and the mixture was stirred for 5 hours. The reaction solution was then concentrated under the reduced pressure, and was poured into 10 L of water. The thus obtained resinous material was filtered off, dried, and again poured into 10 L of water, after the dried product was dissolved in dioxane. The resinous product was filtered off, and dried. The dried product was dissolved in dioxane, and dropwise added to 15 L of hexane. The precipitate was filtered on a glass filter, and dried at 50° C. and 0.1 mmHg for 6 hours. The obtained white powder was again dissolved in dioxane, and the steps of precipitating in 15 L of hexane, filtering and drying the precipitate were twice repeated. Finally, the precipitate was dried at 50° C. and 0.1 mmHg for 16 hours. Yield: 76.62 g (75%).

The NMR analysis of the thus produced copolymer indicated that the molar ratio of each monomeric component in the copolymer is 8:12:30:50 (vinyl:amide:acid:adamantyl). The transmittance of the copolymer at the wavelengths of 193 nm and 248 nm, determined through a 1-$\mu$m thick coating on a quartz substrate, was 65% and 90%, respectively. The dissolution velocity of the copolymer in an aqueous solution of 2.38% tetramethylammonium hydroxide (TMAH) was 1,000 Å/sec. Further, the copolymer had a weight average molecular weight of 18,200 (standard polystyrene conversion) and a degree of dispersion of 1.76.

Example 2

Preparation of Poly(allylmethacrylate-co-N-ethylmethacrylamide-co-methacrylic Acid-co-adamantylmethacrylate)

To a 1 l-volume eggplant-shaped flask, was added 3. 15 g (25 mmol) of allyl methacrylate, 9.62 g (85 mmol) of N-ethylmethacrylamide, 25.32 g (160 mmol) of trimethylsilyl methacrylate, 68.74 g (330 mmol) of adamantylmethacrylate, a Teflon™-coated stir bar, 200 mL of dioxane and 14.78 g (90 mmol) of 2,2'-azobisisobutylonitrile (AIBN), and the content in the flask was stirred at 80° C. for 7 hours in a nitrogen atmosphere. To the reaction solution, 100 mL of a water-methanol (1:1) solution containing 10 g of the dissolved citric acid was added, and the mixture was stirred for 5 hours. The reaction solution was then concentrated under the reduced pressure, and was poured into 10 L of water. The thus obtained resinous material was filtered off, dried, and again poured into 10 L of water, after the dried product was dissolved in dioxane. The resinous product was filtered off, and dried. The dried product was dissolved in dioxane, and dropwise added in 15 L of hexane. The precipitate was filtered on a glass filter, and dried at 50° C. and 0.1 mmHg for 6 hours. The obtained white powder was again dissolved in dioxane, and the steps of precipitating in 15 L of hexane, filtering and drying the precipitate were twice repeated. Finally, the precipitate was dried at 50° C. and 0.1 mmHg for 16 hours. Yield: 76.92 g (72%).

The NMR analysis of the thus produced copolymer indicated that the molar ratio of each monomeric component in the copolymer is 9:11:31:49 (allyl:amide:acid:adamantyl). The transmittance of the copolymer at the wavelengths of 193 nm and 248 nm, determined through a 1-$\mu$m thick coating on a quartz substrate, was 62% and 88%, respectively. The dissolution velocity of the copolymer in an aqueous solution of 2.38% TMAH was 950 Å/sec. Further, the copolymer had a weight average molecular weight of 16,600 (standard polystyrene conversion) and a degree of dispersion of 1.77.

Example 3

Formation of Resist Patterns

The copolymer prepared in the above Example 1 was dissolved in ethyl lactate to make a 20 wt. % ethyl lactate solution thereof. 15 wt. % of γ-butylolactone was added to said solution, and then 4,4'-diazidobiphenyl as a crosslinking agent in an amount of 3 wt. % with regard to the copolymer was added to obtain a resist solution. The resist coating was spin-coated on a silicon oxide ($SiO_2$) substrate which has been treated with HMDS to form a hydrophobic surface, and baked at 90° C. for 100 seconds to form a 0.7-$\mu$m thick resist coating. The resist coating was patternwise exposed on a KrF excimer laser stepper (Nikon, NA=0.45), and baked at 100° C. for 60 seconds. After baking (PEB), the exposed and baked resist coating was developed with an aqueous solution of 2.38% TMAH, and rinsed for 60 seconds in a deionized water. The negative resist patterns were thus obtained. Sensitivity was 100 mJ/$cm^2$, and the resolution was 0.4 $\mu$m line and space (L/S).

The resist patterns were then evaluated with regard to the resistance to Reactive Ion Etching (RIE). The plasma etching rates were determined using the reactive ion etchers for $Cl_2$ and hydrogen bromide (HBr) gases at the pressure of 20 mTorr and the Rf power of 200 W. The observed resistance to RIE was comparable to that of the commercially available Novolak resist: Nagase Positive Resist 820 (Nagase & Co.).

Example 4

Formation of Resist Patterns

The procedure of the above Example 3 was repeated with the proviso that in the exposure step for exposing the resist-coated substrate to patterning radiation, a proximity aligner provided with an ArF excimer laser source was used in a nitrogen atmosphere in place of the KrF excimer laser stepper. Satisfactory negative resist patterns were obtained. Sensitivity was 20 mJ/$cm^2$, and the resolution was 0.25 $\mu$m L/S.

Example 5

Formation of Resist Patterns

The procedure of the above Example 3 was repeated with the proviso that methyl phenylglyoxalate of the above-mentioned formula was used in an amount of 2 wt. % based on the copolymer, in place of 4,4'-diazidobiphenyl, and in the exposure step for exposing the resist-coated substrate to patterning radiation, a proximity aligner provided with an ArF excimer laser source was used in a nitrogen atmosphere in place of the KrF excimer laser stepper. Satisfactory negative resist patterns were obtained. Sensitivity was 25 mJ/$cm^2$, and the resolution was 0.25 $\mu$m L/S.

Example 6

Formation of Resist Patterns

The copolymer prepared in the above Example 2 was dissolved in ethyl lactate to make a 20 wt. % ethyl lactate solution thereof. 15 wt. % of propyleneglycol monomethylether was added to said solution, and then 4,4'-diazidobiphenyl in an amount of 3 wt. % with regard to the copolymer was added to obtain a resist solution. The resist coating was spin-coated on a $SiO_2$ substrate which has been treated with HMDS to form a hydrophobic surface, and baked at 90° C. for 100 seconds to form a 0.7-$\mu$m thick resist coating. The resist coating was patternwise exposed on a KrF excimer laser stepper (Nikon, NA=0.45), and baked at 100° C. for 60 seconds. After baking (PEB), the exposed and baked resist coating was developed with an aqueous solution of 2.38% TMAH, and rinsed for 60 seconds in a deionized water. The negative resist patterns were thus obtained. Sensitivity was 110 mJ/$cm^2$, and the resolution was 0.4 $\mu$m L/S.

The resist patterns were then evaluated with regard to the resistance to Reactive Ion Etching (RIE). The plasma etching rates were determined using the reactive ion etchers for $Cl_2$ and hydrogen bromide (HBr) gases at the pressure of 20 mTorr and the Rf power of 200 W. The observed resistance to RIE was comparable to that of the commercially available Novolak resist: Nagase Positive Resist 820 (Nagase & Co.).

Example 7

Formation of Resist Patterns

The procedure of the above Example 6 was repeated with the proviso that in the exposure step for exposing the resist-coated substrate to patterning radiation, a proximity aligner provided with an ArF excimer laser source was used in a nitrogen atmosphere in place of the KrF excimer laser stepper. Satisfactory negative resist patterns were obtained. Sensitivity was 28 mJ/$cm^2$, and the resolution was 0.25 $\mu$m L/S.

Example 8

Formation of Resist Patterns

The procedure of the above Example 3 was repeated with the proviso that methyl phenylglyoxalate of the above-mentioned formula was used in an amount of 2 wt. % based on the copolymer, in place of 4,4'-diazidobiphenyl, and in the exposure step for exposing the resist-coated substrate to patterning radiation, a proximity aligner provided with an ArF excimer laser source was used in a nitrogen atmosphere in place of the KrF excimer laser stepper. Satisfactory negative resist patterns were obtained. Sensitivity was 30 mJ/$cm^2$, and the resolution was 0.25 $\mu$m L/S.

We claim:

1. A process for the formation of resist patterns which comprises the steps of:

coating a resist composition on a substrate to be fabricated, said resist composition comprising:

A. a (meth)acrylate copolymer having a weight average molecular weight of 2,000 to 1,000,000, said copolymer comprising the following repeating units:
(a) a vinyl monomer unit which contains, in a side chain thereof, at least one carbon—carbon double bond which does not concern itself with any polymerization reaction, but is able to be crosslinked with a crosslinking agent which is used in combination with said copolymer, said monomer unit being able to be copolymerized with an acrylic acid or methacrylic acid ester and being in an amount of more than 0 mole % and not more than 50 mole % based on said copolymer,
(b) an acrylamide or methacrylamide monomer unit in an amount of more than 0 mole % and not more than 70 mole % based on said copolymer,
(c) an acrylic acid or methacrylic acid monomer unit in an amount of more than 0 mole % and not more than 30 mole % based on said copolymer,
(d) an acrylic acid or methacrylic acid adamantyl monomer unit in an amount of more than 0 mole % and not more than 70 mole % based on said copolymer, and
B. a crosslinking agent capable of being decomposed upon exposure to a patterning radiation and then causing a crosslinking reaction of said copolymer upon the subsequent heating, thereby forming a resist coating;

selectively exposing said resist coating to a patterning radiation capable of causing a decomposition of said crosslinking agent in said resist composition;

heating the exposed resist coating to a temperature at which a crosslinking reaction of said copolymer in said resist composition is induced; and developing the heated resist coating with an aqueous basic solution as a developer.

2. The process according to claim 1, in which the (meth)acrylate copolymer is represented by the following structural formula (I):

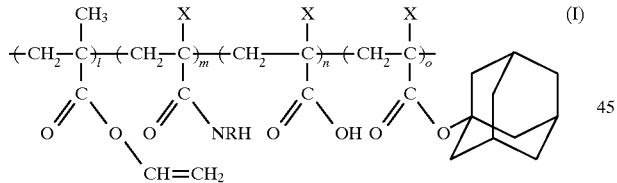

in which

X represents a hydrogen atom or a substituted or unsubstituted alkyl group of 1 to 3 carbon atoms, R represents a hydrogen atom or a substituted or unsubstituted, straight or branched chain alkyl group of 1 to 6 carbon atoms, and l, m, n and o each represents the molar fraction of the units (a), (b), (c) and (d).

3. The process according to claim 1 or 2, in which the (meth)acrylate copolymer exhibits a transmittance of at least 30%, when determined through a 1 μm thick-resist coating containing said copolymer on a quartz substrate at a wavelength in the deep ultraviolet region of an exposure radiation.

4. The process according to claim 1 or 2, in which, in the formation of the resist coating, said resist composition is coated from a resist solution thereof in at least one solvent selected from the group consisting of ethyl lactate, methyl amyl ketone, methyl-3-methoxypropionate, ethyl-3-ethoxypropionate and propyleneglycol methyletheracetate.

5. The process according to claim 4, in which said resist solution further comprises at least one auxiliary solvent selected from the group consisting of butyl acetate, γ-butyrolactone and propyleneglycol methylether.

6. The process according to claim 1 or 2, which further comprises the step of heating the resist coating before exposure thereof to the patterning radiation.

7. The process according to claim 1 or 2, which comprises the steps of:

spin-coating the resist composition from a solution thereof in an organic solvent on the substrate to form a resist coating having a thickness of 0.1 to 200 μm;

prebaking the resist coating at 60° to 160° C. for 60 to 120 seconds;

selectively exposing the prebaked resist coating to a patterning radiation from an excimer laser or deep UV source;

post-exposure baking the exposed resist coating at 80° to 160° C. for 30 to 240 seconds; and developing the baked resist coating with the aqueous basic solution as the developer, thereby forming negative resist patterns.

* * * * *